United States Patent
Wang et al.

(10) Patent No.: US 9,040,422 B2
(45) Date of Patent: May 26, 2015

(54) SELECTIVE TITANIUM NITRIDE REMOVAL

(71) Applicant: Applied Materials, Inc., Santa Clara, CA (US)

(72) Inventors: Xikun Wang, Sunnyvale, CA (US); Anchuan Wang, San Jose, CA (US); Nitin K. Ingle, San Jose, DE (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/908,107

(22) Filed: Jun. 3, 2013

(65) Prior Publication Data

US 2014/0256131 A1 Sep. 11, 2014

Related U.S. Application Data (60) Provisional application No. 61/772,658, filed on Mar. 5, 2013.

(51) Int. Cl.
 *H01L 21/3213* (2006.01)
 *H01L 21/48* (2006.01)
 (Continued)

(52) U.S. Cl.
 CPC .......... *H01L 21/32136* (2013.01); *H01L 21/28* (2013.01); *H01L 21/4814* (2013.01);
 (Continued)

(58) Field of Classification Search
 USPC ........................................................ 438/727
 See application file for complete search history.

(56) References Cited

U.S. PATENT DOCUMENTS

| 2,369,620 A | 2/1945 | Sullivan et al. |
|---|---|---|
| 3,451,840 A | 6/1969 | Hough |

(Continued)

FOREIGN PATENT DOCUMENTS

| CN | 1375575 | 10/2002 |
|---|---|---|
| CN | 1412861 A | 4/2003 |

(Continued)

OTHER PUBLICATIONS

C.K. Hu, et al. "Reduced Electromigration of Cu Wires by Surface Coating" Applied Physics Letters, vol. 81, No. 10, Sep. 2, 2002—pp. 1782-1784.

(Continued)

*Primary Examiner* — Angel Roman
(74) *Attorney, Agent, or Firm* — Kilpatrick Townsend & Stockton LLP (57) ABSTRACT

Methods are described herein for selectively etching titanium nitride relative to dielectric films, which may include, for example, alternative metals and metal oxides lacking in titanium and/or silicon-containing films (e.g. silicon oxide, silicon carbon nitride and low-K dielectric films). The methods include a remote plasma etch formed from a chlorine-containing precursor. Plasma effluents from the remote plasma are flowed into a substrate processing region where the plasma effluents react with the titanium nitride. The plasma effluents react with exposed surfaces and selectively remove titanium nitride while very slowly removing the other exposed materials. The substrate processing region may also contain a plasma to facilitate breaking through any titanium oxide layer present on the titanium nitride. The plasma in the substrate processing region may be gently biased relative to the substrate to enhance removal rate of the titanium oxide layer.

19 Claims, 5 Drawing Sheets

(51) Int. Cl.
  *H01L 21/28*    (2006.01)
  *H01L 21/3065*  (2006.01)
  *H01J 37/32*    (2006.01)

(52) U.S. Cl.
  CPC ...... *H01L21/3065* (2013.01); *H01L 21/32135* (2013.01); *H01J 37/32357* (2013.01); *H01J 37/3244* (2013.01)

(56) References Cited

U.S. PATENT DOCUMENTS

| | | | |
|---|---|---|---|
| 3,937,857 A | 2/1976 | Brummett et al. | |
| 4,006,047 A | 2/1977 | Brummett et al. | |
| 4,209,357 A | 6/1980 | Gorin et al. | |
| 4,214,946 A | 7/1980 | Forget et al. | |
| 4,232,060 A | 11/1980 | Mallory, Jr. | |
| 4,234,628 A | 11/1980 | DuRose | |
| 4,265,943 A | 5/1981 | Goldstein et al. | |
| 4,364,803 A | 12/1982 | Nidola et al. | |
| 4,368,223 A | 1/1983 | Kobayashi et al. | |
| 4,397,812 A | 8/1983 | Mallory, Jr. | |
| 4,468,413 A | 8/1984 | Bachmann | |
| 4,565,601 A | 1/1986 | Kakehi et al. | |
| 4,571,819 A | 2/1986 | Rogers et al. | |
| 4,579,618 A | 4/1986 | Celestino et al. | |
| 4,585,920 A | 4/1986 | Hoog et al. | |
| 4,625,678 A | 12/1986 | Shloya et al. | |
| 4,632,857 A | 12/1986 | Mallory, Jr. | |
| 4,656,052 A | 4/1987 | Satou et al. | |
| 4,690,746 A | 9/1987 | McInerney et al. | |
| 4,714,520 A | 12/1987 | Gwozdz | |
| 4,749,440 A | 6/1988 | Blackwood et al. | |
| 4,753,898 A | 6/1988 | Parrillo et al. | |
| 4,807,016 A | 2/1989 | Douglas | |
| 4,810,520 A | 3/1989 | Wu | |
| 4,816,638 A | 3/1989 | Ukai et al. | |
| 4,851,370 A | 7/1989 | Doklan et al. | |
| 4,865,685 A | 9/1989 | Palmour | |
| 4,872,947 A | 10/1989 | Wang et al. | |
| 4,878,994 A * | 11/1989 | Jucha et al. | 438/711 |
| 4,886,570 A | 12/1989 | Davis et al. | |
| 4,892,753 A | 1/1990 | Wang et al. | |
| 4,894,352 A | 1/1990 | Lane et al. | |
| 4,904,341 A | 2/1990 | Blaugher et al. | |
| 4,951,601 A | 8/1990 | Maydan et al. | |
| 4,960,488 A | 10/1990 | Law et al. | |
| 4,980,018 A * | 12/1990 | Mu et al. | 438/9 |
| 4,981,551 A | 1/1991 | Palmour | |
| 4,985,372 A | 1/1991 | Narita et al. | |
| 4,994,404 A | 2/1991 | Sheng et al. | |
| 5,000,113 A | 3/1991 | Wang et al. | |
| 5,013,691 A | 5/1991 | Lory et al. | |
| 5,030,319 A | 7/1991 | Nishino et al. | |
| 5,061,838 A | 10/1991 | Lane et al. | |
| 5,089,441 A | 2/1992 | Moslehi | |
| 5,089,442 A | 2/1992 | Olmer | |
| 5,147,692 A | 9/1992 | Bengston | |
| 5,156,881 A | 10/1992 | Okano et al. | |
| 5,186,718 A | 2/1993 | Tepman et al. | |
| 5,198,034 A | 3/1993 | deBoer et al. | |
| 5,203,911 A | 4/1993 | Sricharoenchalkit et al. | |
| 5,215,787 A | 6/1993 | Homma | |
| 5,228,501 A | 7/1993 | Tepman et al. | |
| 5,231,690 A | 7/1993 | Soma et al. | |
| 5,235,139 A | 8/1993 | Bengston et al. | |
| 5,238,499 A | 8/1993 | van de Ven et al. | |
| 5,240,497 A | 8/1993 | Shacham et al. | |
| 5,248,527 A | 9/1993 | Uchida et al. | |
| 5,252,178 A | 10/1993 | Moslehi | |
| 5,266,157 A | 11/1993 | Kadomura | |
| 5,270,125 A | 12/1993 | America et al. | |
| 5,271,972 A | 12/1993 | Kwok et al. | |
| 5,275,977 A | 1/1994 | Otsubo et al. | |
| 5,279,865 A | 1/1994 | Chebi et al. | |
| 5,288,518 A | 2/1994 | Homma | |
| 5,290,382 A | 3/1994 | Zarowin et al. | |
| 5,300,463 A | 4/1994 | Cathey et al. | |
| 5,302,233 A | 4/1994 | Kim et al. | |
| 5,306,530 A | 4/1994 | Strongin et al. | |
| 5,314,724 A | 5/1994 | Tsukune et al. | |
| 5,316,804 A | 5/1994 | Tomikawa et al. | |
| 5,319,247 A | 6/1994 | Matsuura | |
| 5,326,427 A * | 7/1994 | Jerbic | 438/727 |
| 5,328,558 A | 7/1994 | Kawamura et al. | |
| 5,328,810 A | 7/1994 | Lowrey et al. | |
| 5,334,552 A | 8/1994 | Homma | |
| 5,345,999 A | 9/1994 | Hosokawa | |
| 5,352,636 A | 10/1994 | Beinglass | |
| 5,362,526 A | 11/1994 | Wang et al. | |
| 5,368,897 A | 11/1994 | Kurihara et al. | |
| 5,380,560 A | 1/1995 | Kaja et al. | |
| 5,382,311 A | 1/1995 | Ishikawa et al. | |
| 5,384,284 A | 1/1995 | Doan et al. | |
| 5,385,763 A | 1/1995 | Okano et al. | |
| 5,399,529 A | 3/1995 | Homma | |
| 5,403,434 A | 4/1995 | Moslehi | |
| 5,413,967 A | 5/1995 | Matsuda et al. | |
| 5,415,890 A | 5/1995 | Kloiber et al. | |
| 5,416,048 A | 5/1995 | Blalock et al. | |
| 5,420,075 A | 5/1995 | Homma et al. | |
| 5,429,995 A | 7/1995 | Nishiyama et al. | |
| 5,439,553 A | 8/1995 | Grant et al. | |
| 5,451,259 A | 9/1995 | Krogh | |
| 5,468,342 A | 11/1995 | Nulty et al. | |
| 5,474,589 A | 12/1995 | Ohga et al. | |
| 5,478,403 A | 12/1995 | Shinigawa et al. | |
| 5,478,462 A | 12/1995 | Walsh | |
| 5,483,920 A | 1/1996 | Pryor | |
| 5,500,249 A | 3/1996 | Telford et al. | |
| 5,505,816 A | 4/1996 | Barnes et al. | |
| 5,510,216 A | 4/1996 | Calabrese et al. | |
| 5,516,367 A | 5/1996 | Lei et al. | |
| 5,531,835 A | 7/1996 | Fodor et al. | |
| 5,534,070 A | 7/1996 | Okamura et al. | |
| 5,536,360 A | 7/1996 | Nguyen et al. | |
| 5,549,780 A | 8/1996 | Koinuma et al. | |
| 5,558,717 A | 9/1996 | Zhao et al. | |
| 5,560,779 A | 10/1996 | Knowles et al. | |
| 5,563,105 A | 10/1996 | Dobuzinsky et al. | |
| 5,571,576 A | 11/1996 | Qian et al. | |
| 5,578,130 A | 11/1996 | Hayashi et al. | |
| 5,591,269 A | 1/1997 | Arami et al. | |
| 5,599,740 A | 2/1997 | Jang et al. | |
| 5,624,582 A | 4/1997 | Cain | |
| 5,626,922 A | 5/1997 | Miyanaga et al. | |
| 5,645,645 A | 7/1997 | Zhang et al. | |
| 5,648,125 A | 7/1997 | Cane | |
| 5,648,175 A | 7/1997 | Russell et al. | |
| 5,656,093 A | 8/1997 | Burkhart et al. | |
| 5,661,093 A | 8/1997 | Ravi et al. | |
| 5,674,787 A | 10/1997 | Zhao et al. | |
| 5,679,606 A | 10/1997 | Wang et al. | |
| 5,688,331 A | 11/1997 | Aruga et al. | |
| 5,695,810 A | 12/1997 | Dubin et al. | |
| 5,712,185 A | 1/1998 | Tsai et al. | |
| 5,716,500 A | 2/1998 | Bardos et al. | |
| 5,716,506 A | 2/1998 | Maclay et al. | |
| 5,719,085 A | 2/1998 | Moon et al. | |
| 5,733,816 A | 3/1998 | Iyer et al. | |
| 5,747,373 A | 5/1998 | Yu | |
| 5,755,859 A | 5/1998 | Brusic et al. | |
| 5,756,402 A | 5/1998 | Jimbo et al. | |
| 5,781,693 A | 7/1998 | Ballance et al. | |
| 5,786,276 A | 7/1998 | Brooks et al. | |
| 5,789,300 A | 8/1998 | Fulford | |
| 5,800,686 A | 9/1998 | Littau et al. | |
| 5,804,259 A | 9/1998 | Robles | |
| 5,812,403 A | 9/1998 | Fong et al. | |
| 5,820,723 A | 10/1998 | Benjamin et al. | |
| 5,824,599 A | 10/1998 | Schacham-Diamand et al. | |
| 5,830,805 A | 11/1998 | Schacham-Diamand et al. | |
| 5,838,055 A | 11/1998 | Kleinhenz et al. | |
| 5,843,538 A | 12/1998 | Ehrsam et al. | |
| 5,844,195 A | 12/1998 | Fairbairn et al. | |

(56) References Cited

U.S. PATENT DOCUMENTS

| | | |
|---|---|---|
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A * | 12/1999 | Abraham ................ 438/714 |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsuing et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,752 B1 | 8/2001 | Chen |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |

(56) References Cited

U.S. PATENT DOCUMENTS

| | | |
|---|---|---|
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,500,728 B1 | 12/2002 | Wang |
| 6,503,843 B1 | 1/2003 | Xia et al. |
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,390,710 B2 | 6/2008 | Derderian et al. |
| 7,396,480 B2 | 7/2008 | Kao et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,642,481 B2 | 2/2014 | Wang et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0055842 A1 | 12/2001 | Uh et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0098681 A1 | 7/2002 | Hu et al. |
| 2002/0124867 A1 | 9/2002 | Kim et al. |
| 2002/0177322 A1 | 11/2002 | Li et al. |
| 2002/0187655 A1 | 12/2002 | Tan et al. |
| 2002/0197823 A1 | 12/2002 | Yoo et al. |
| 2003/0010645 A1 | 1/2003 | Ting et al. |
| 2003/0019428 A1 | 1/2003 | Ku et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |

(56) References Cited

U.S. PATENT DOCUMENTS

| | | |
|---|---|---|
| 2003/0038305 A1 | 2/2003 | Wasshuber |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000805 A1 | 1/2006 | Todorow et al. |
| 2006/0019456 A1 | 1/2006 | Bu et al. |
| 2006/0019486 A1 | 1/2006 | Yu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0166107 A1 | 7/2006 | Chen et al. |
| 2006/0166515 A1 | 7/2006 | Karim et al. |
| 2006/0185592 A1 | 8/2006 | Matsuura |
| 2006/0207504 A1 | 9/2006 | Hasebe et al. |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1* | 5/2007 | Shamiryan et al. ........... 438/712 |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0181057 A1 | 8/2007 | Lam et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Hua et al. |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0230519 A1* | 9/2008 | Takahashi ...................... 216/64 |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0189246 A1 | 7/2009 | Wu et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0280650 A1 | 11/2009 | Lubomirsky et al. |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0173499 A1 | 7/2010 | Tao et al. |
| 2010/0187534 A1 | 7/2010 | Nishi et al. |
| 2010/0330814 A1 | 12/2010 | Yokota et al. |
| 2011/0008950 A1 | 1/2011 | Xu |
| 2011/0034035 A1 | 2/2011 | Liang et al. |
| 2011/0053380 A1 | 3/2011 | Sapre et al. |
| 2011/0081782 A1 | 4/2011 | Liang et al. |
| 2011/0143542 A1 | 6/2011 | Feurprier et al. |
| 2011/0151674 A1 | 6/2011 | Tang et al. |

(56) References Cited

U.S. PATENT DOCUMENTS

| | | |
|---|---|---|
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0165771 A1 | 7/2011 | Ring et al. |
| 2011/0195575 A1 | 8/2011 | Wang |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0068242 A1 | 3/2012 | Shin et al. |
| 2012/0135576 A1 | 5/2012 | Lee et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0260533 A1 | 10/2013 | Sapre et al. |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2002-256235 | 9/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 2/2005 |
| JP | 2007-173383 A | 7/2007 |
| JP | 08-148470 A | 6/2008 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 1020030081177 | 10/2003 |
| KR | 10-2004-0049739 A | 6/2004 |
| KR | 10-2004-0096365 A | 11/2004 |
| KR | 1020050042701 A | 5/2005 |
| KR | 1020080063988 A | 7/2008 |
| KR | 10-2010-0013980 A | 2/2010 |
| KR | 10-2010-0074508 A | 7/2010 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 9954920 A2 | 10/1999 |
| WO | 99/62108 A2 | 12/1999 |
| WO | 00/13225 A1 | 3/2000 |
| WO | 00/22671 | 4/2000 |
| WO | 0022671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

European Search Report dated May 23, 2006 for EP Application No. 05251143.3.

European Examination Report dated Nov. 13, 2007 for EP Application No. 05251143.3.

EP Partial Search Report, Application No. 08150111.601235/1944796, dated Aug. 22, 2008.

Eze, F. C., "Eiectroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 mailed on Apr. 26, 2010, 4 pages.

International Search Report of PCT/US2012/061726 mailed on May 16, 2013, 3 pages.

International Search Report of PCT/2013/052039 mailed on Nov. 8, 2013, 9 pages.

International Search Report of PCT/2013/037202 mailed on Aug. 23, 2013, 11 pages.

Lin, et al., "Manufacturing of Cu Electroless Nickei/Sn-Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

Musaka, "Single Step Gap Filling Technology fo Subhalf Micron Metal Spacings on Plasma Enhanced TEOS/$O_2$ Chemical Vapor (56) References Cited

OTHER PUBLICATIONS

Deposition System," Extended Abstracts of the 1993 International Conference on Solid State Devices and Materials pp. 1993, 510-512.
Pearlstein, Fred. "Eiectroless Plating," J. Res. Natl. Bur. Stan., Ch. 31 (1974), pp. 710-747.
Saito, et al., "Eiectroless deposition of Ni-B, Co-B and Ni-Co-B alloys using dimethylamineborane as a reducing agent," Journal of Applied Electrochemistry 28 (1998), pp. 559-563.
Schacham-Diamond, et al., "Electrochemically deposited thin film alloys for ULSI and MEMS applications," Microelectronic Engineering 50 (2000), pp. 525-531.
Schacham-Diamond, et al. "Material properties of electroless 100-200 nm thick CoWP films," Electrochemical Society Proceedings, vol. 99-34, pp. 102-110.
Smayling, et al., "APF® Pitch-Halving for 2nm Logic Cells using Gridded Design Rules", proceedings of the SPIE, 2008, 8 pages.
Vassiliev, et al., "Trends in void-free pre-metal CVD dielectrics," Solid State Technology, Mar. 2001, pp. 129-136.
Weston, et al., "Ammonium Compounds," Kirk-Othmer Encyclopedia of Chemical Technology, 2003,30 pages see pp. 717-718, John Wiley & Sons, Inc.
Yosi Shacham-Diamond, et al. "High Aspect Ratio Quarter-Micron Electroless Copper Integrated Technology", Microelectronic Engineering 37/38 (1997) pp. 77-88.
Li, D. et al., "HDP-CVD dep/etch/dep Process for Improved Deposition into High Aspect Ratio Features," U.S. Patent No. 6,908,862 published Jun. 21, 2005.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pages.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3.
Fukada et al. "Preparation of SiOF Films with Low Dielectric Constant by ECR Plasma CVD", ISMIC, DUMIC Conference, Feb. 21-22, 1995, pp. 43-49.
Hashim et al.; Characterization of thin oxide removal by RTA Treatment; ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant $SiO_2$ CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011.
Japanese Patent Office, Official Action for Application No. 2007-317207 mailed on Dec. 21, 2011, 2 pages.
Jung, et al., "Patterning with amorphous carbon spacer for expanding the resolution limit of current lithography tool", Proc. SPIE , 2007, 9 pages, vol. 6520, 65201C.
Laxman, "Low $\epsilon$ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, 1995. pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, 1995. pp. 118-123.
S.M. Sze, VLSI Technology, McGraw-Hill Book Company, pp. 107, 108.
The Chinese Journal of Nonferrous Metals, vol. 10, No. 1, Feb. 2, 2000, Abstract included.
U.S. Appl. No. 60/803,499, filed May 30, 2006, 56 pages.
U.S. Appl. No. 11/875,250, filed Oct. 19, 2007, 36 pages.
Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.
Wang et al.; Ultra High-selectivity silicon nitride etch process using an inductively coupled plasma source; J. Vac. Sci. Techno!. A 16(3),May/Jun. 1998, pp. 1582-1587.
Wolf et al.; Silicon Processing for the VLSI Era; vol. 1; 1986; Lattice Press, pp. 546, 547, 618, 619.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

* cited by examiner

SELECTIVE TITANIUM NITRIDE REMOVAL

CROSS-REFERENCES TO RELATED APPLICATIONS

This application claims the benefit of U.S. Prov. Pat. App. No. 61/772,658 filed Mar. 5, 2013, and titled "SELECTIVE TITANIUM NITRIDE REMOVAL," which is hereby incorporated herein in its entirety by reference for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials. However, there are few options for selectively etching titanium nitride with dry etch processes.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have recently been developed to selectively remove several dielectrics relative to one another. However, dry-etch processes are still needed, which delicately remove titanium nitride in a variety of novel process flows.

BRIEF SUMMARY OF THE INVENTION

Methods are described herein for selectively etching titanium nitride relative to dielectric films, which may include, for example, alternative metals and metal oxides lacking in titanium and/or silicon-containing films (e.g. silicon oxide, silicon carbon nitride and low-K dielectric films). The methods include a remote plasma etch formed from a chlorine-containing precursor. Plasma effluents from the remote plasma are flowed into a substrate processing region where the plasma effluents react with the titanium nitride. The plasma effluents react with exposed surfaces and selectively remove titanium nitride while very slowly removing the other exposed materials. The substrate processing region may also contain a plasma to facilitate breaking through any titanium oxide layer present on the titanium nitride. The plasma in the substrate processing region may be gently biased relative to the substrate to enhance removal rate of the titanium oxide layer.

Embodiments of the invention include methods of etching patterned substrates in a substrate processing region of a substrate processing chamber. The patterned substrates have an exposed titanium nitride region and an exposed second material region. The methods include flowing a chlorine-containing precursor into a remote plasma region fluidly coupled to the substrate processing region while forming a plasma in the plasma region to produce plasma effluents. The methods further include etching exposed titanium nitride from the substrate by flowing the plasma effluents into the substrate processing region through through-holes in a showerhead.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Methods are described herein for selectively etching titanium nitride relative to dielectric films, which may include, for example, alternative metals and metal oxides lacking in titanium and/or silicon-containing films (e.g. silicon oxide, silicon carbon nitride and low-K dielectric films). The methods include a remote plasma etch formed from a chlorine-containing precursor. Plasma effluents from the remote plasma are flowed into a substrate processing region where the plasma effluents react with the titanium nitride. The plasma effluents react with exposed surfaces and selectively remove titanium nitride while very slowly removing the other exposed materials. The substrate processing region may also contain a plasma to facilitate breaking through any titanium oxide layer present on the titanium nitride. The plasma in the substrate processing region may be gently biased relative to the substrate to enhance removal rate of the titanium oxide layer.

An ion suppression element may be included in the etch processes discussed herein in order to achieve high titanium nitride selectivity. The ion suppression element functions to reduce or eliminate ionically charged species traveling from the plasma generation region to the substrate. Uncharged neutral and radical species may pass through the openings in the ion suppressor to react at the substrate. The ion suppressor helps control the concentration of ionic species in the reaction region at a level that assists the process.

In accordance with some embodiments of the invention, an ion suppressor as described in the exemplary equipment section may be used to provide radical and/or neutral species for selectively etching substrates. The ion suppressor is used to provide chlorine-containing plasma effluents to selectively etch titanium nitride. The ion suppressor may be used to provide a reactive gas having a higher concentration of radicals than ions. Because most of the charged particles of a plasma are filtered or removed by the ion suppressor, the substrate is not necessarily biased during the etch process. Such a process using radicals and other neutral species can reduce plasma damage compared to conventional plasma etch processes that include significant sputtering and bombardment. A local plasma may be included in the substrate processing region to optionally provide sputtering in order to remove (e.g. native) titanium oxide from atop the titanium nitride to be etched. The local plasma may be biased relative to the substrate to supply a sputtering component to the etch. The local plasma may have a lower power than the remote plasma, in which case the local plasma may be maintained throughout the etch of the titanium nitride without compromising the titanium nitride selectivity. Embodiments of the present invention are also advantageous over conventional wet etch processes where surface tension of liquids can cause bending and peeling of small features.

Figure 1:
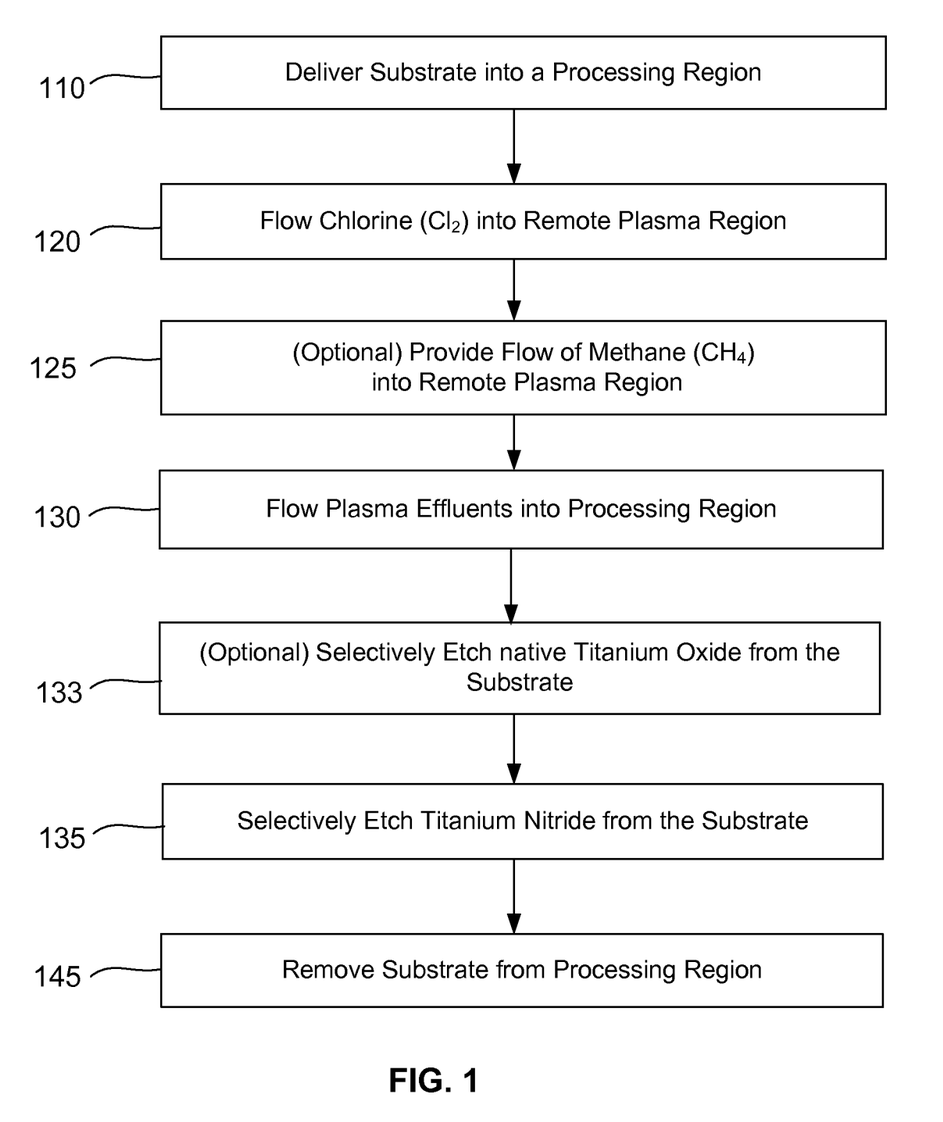
FIG. 1 is a flow chart of a titanium nitride selective etch process according to disclosed embodiments.

In order to better understand and appreciate the invention, reference is now made to FIG. 1 which is a flow chart of a titanium nitride selective etch process according to disclosed embodiments. The titanium nitride film of this example has a thin native oxide layer on its surface due to atmospheric exposure. The titanium nitride may be in the form of a blanket layer on the substrate or it may reside in discrete regions of a patterned substrate surface. In either case, the titanium nitride forms exposed surfaces of the surface of the substrate once the native oxide layer is removed. The substrate is then delivered into a processing region (operation 110). A thin layer of titanium oxide may or may not be present over the otherwise exposed titanium nitride regions of the substrate prior to delivering the substrate into the processing region.

A flow of chlorine ($Cl_2$) is introduced into a plasma region separate from the processing region (operation 120). Other sources of chlorine may be used to augment or replace the chlorine. In general, a chlorine-containing precursor may be flowed into the plasma region, such as chlorine ($Cl_2$), xenon dichloride or boron trichloride. The separate plasma region may be referred to as a remote plasma region herein and may be within a distinct module from the processing chamber or a compartment within the processing chamber. A carbon-and-hydrogen-containing precursor, in this case methane ($CH_4$) is also flowed into the plasma region (operation 125) where it is simultaneously excited in a plasma along with the chlorine. The carbon-and-hydrogen-containing precursor is flowed into the plasma region during the operation of flowing the chlorine-containing precursor. The carbon-and-hydrogen-containing precursor is optional and included primarily to help remove titanium oxide from the surface of the titanium nitride.

The plasma effluents formed in the remote plasma region are then flowed into the substrate processing region (operation 130). In the example, and often in practice, a native titanium oxide layer exists above the titanium nitride as a result of exposure to atmosphere. The native titanium oxide is removed by flowing the plasma effluents into the substrate processing region (operation 133). Once the native titanium oxide is broken through, titanium nitride on the substrate is selectively etched (operation 135) such that titanium nitride may be removed more rapidly than a variety of other materials, if other materials are present. The selective etch disclosed in all examples disclosed herein may etch titanium nitride significantly faster than a variety of titanium-free dielectric materials which may include hafnium oxide ($HfO_2$) or a silicon-containing material such as silicon (e.g. polysilicon), silicon oxide, low-K dielectric, silicon nitride or silicon carbon nitride in embodiments of the invention. Such a process may have broad-based utility, for example, the etch processes disclosed herein may be used to selectively remove titanium nitride from atop a silicon-containing film stack after patterning. The reactive chemical species and any process effluents are removed from the substrate processing region and then the substrate is removed from the processing region (operation 145).

Chlorine, or a chlorine-containing precursor in general, has been found by the inventors to enable selectivities unobtainable with fluorine-based chemistries. Applicants suppose that including fluorine necessarily increases the removal rate of silicon-containing films which limits the etch selectivity towards titanium nitride. Applicants further suppose that titanium nitride interacts with radical chlorine produced in the remote plasma region to form titanium chloride and nitrogen chloride fragments which have high vapor pressure in comparison with titanium fluoride and nitrogen fluoride complexes. On the other hand, applicants found that radical chlorine removed silicon oxide, low-K dielectric, silicon nitride, silicon carbon nitride much more slowly than titanium nitride. Metals other than titanium (as well as their oxides) were also observed to have been etched very slowly, likely due to low vapor pressures of their chlorine-metal chemical fragments.

The etch selectivity (titanium nitride:secondary material other than titanium nitride) of the processes disclosed herein may be greater than or about 10:1, greater than or about 20:1, greater than or about 50:1, or greater than or about 100:1 for materials other than titanium nitride in embodiments of the invention. Applying a bias power, but keeping the level low as recited shortly, has been found by the inventors to enable very high selectivities to be achieved. The inventors have found that the processes disclosed herein display etch selectivities of titanium nitride relative to a variety of specific materials. The etch selectivity of titanium nitride relative to silicon nitride may be greater than or about 100:1, greater than or about 250:1, greater than or about 500:1 or greater than or about 1000:1 in disclosed embodiments. In practice, under conditions of low bias power in the substrate processing region local plasma, etch rates of silicon nitride and silicon oxide were so low as to be not accurately measurable. The etch selectivity of titanium nitride relative to silicon oxide may be greater than or about 100:1, greater than or about 250:1, greater than or about 500:1 or greater than or about 1000:1 in embodiments of the invention. Low K dielectric films, such as Black Diamond III™ available from Applied Materials, were also found to sustain essentially unmeasurable etch rates. The etch selectivity of titanium nitride relative to silicon oxycarbide (e.g. Black Diamond III™) may be greater than or about 100:1, greater than or about 250:1, greater than or about 500:1 or greater than or about 1000:1 in embodiments of the invention. A low etch rate was observed for silicon carbon nitride, such as Blok™ available from Applied Materials, but was still much less than the titanium nitride etch rate. The etch selectivity of titanium nitride relative to silicon carbon nitride may be greater than or about 5:1, greater than or about 8:1, greater than or about 12:1 or greater than or about 15:1 in embodiments of the invention.

The carbon-and-hydrogen-containing precursor is included primarily to help remove the titanium oxide layer from atop the titanium nitride layer. The carbon-and-hydrogen-containing precursor may be methane ($CH_4$) as in the example, but may also be a higher order hydrocarbon such as ethane ($C_2H_6$). In general, the carbon-and-hydrogen-containing precursor may include carbon and hydrogen and may consist only of carbon and hydrogen. The carbon-and-hydrogen-containing precursor may contain only single bonds in disclosed embodiments. A hydrocarbon with some multiple bonds may be used and hydrogen ($H_2$) may be added to the remote plasma region as well, during the process, in order to adjust the H:C atomic flow ratio.

The flows of the chlorine-containing precursor and the carbon-and-hydrogen-containing precursor may further include one or more relatively inert gases such as He, $N_2$, Ar. The inert gas can be used to improve plasma stability, process uniformity and the like. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

In disclosed embodiments, the chlorine-containing precursor (e.g. $Cl_2$) is supplied at a flow rate of between about 25 sccm (standard cubic centimeters per minute) and 800 sccm, the carbon-and-hydrogen-containing precursor (e.g. $CH_4$) at a flow rate of between about 50 sccm and 600 sccm, He at a flow rate of between about 0 slm (standard liters per minute) and 3 slm, and Ar at a flow rate of between about 0 slm and 3 slm. One of ordinary skill in the art would recognize that other gases and/or flows may be used depending on a number of factors including processing chamber configuration, substrate size, geometry and layout of features being etched, and the like.

The method also includes applying energy to the chlorine-containing precursor and the carbon-and-hydrogen-containing precursor ($CH_4$) while they are in the remote plasma region to generate the plasma effluents. As would be appreciated by one of ordinary skill in the art, the plasma may include a number of charged and neutral species including radicals and ions. The plasma in the remote plasma region (e.g. in the chamber plasma region) may be generated using known techniques (e.g., radio frequency excitations, capacitively-coupled power, inductively coupled power, and the like). In an embodiment, the energy is applied using a capacitively-coupled plasma unit. The remote plasma source power may be between about 40 watts and about 1500 watts, between about 100 watts and about 1200 watts, between about 250 watts and about 1000 watts, or between about 400 watts and about 800 watts in embodiments of the invention.

The narrowest RF power embodiment optimizes the selective removal of titanium nitride relative to a variety of other exposed materials including silicon-containing dielectric films as well as some metals and metal oxides which do not contain titanium. The pressure in the remote plasma region may be such that the pressure in the substrate processing region ends up between about 0.01 Torr and about 20 Torr or between about 0.1 Torr and about 5 Torr in disclosed embodiments. The capacitively-coupled plasma unit may be disposed remote from a gas reaction region (aka substrate processing region) of the processing chamber. For example, the capacitively-coupled plasma unit and the plasma generation region may be separated from the gas reaction region by a showerhead.

Plasma power may also be simultaneously applied to both the remote plasma region (e.g. the chamber plasma region) and substrate processing region during etching processes described herein. The plasma in the chamber plasma region may have a higher power applied in order to create a high concentration of neutral radicals entering substrate processing region. The plasma power applied to substrate processing region may be lower in order to not unduly increase the ionic concentration near the substrate. However, the local plasma in the substrate processing region may be biased relative to the substrate in order to apply a sputtering component. A sputtering component of the local plasma may be included primarily to remove titanium oxide which may cover the titanium nitride to be etched. The plasma in the substrate processing region may be referred to herein as a local plasma because it resides nearest the substrate and within the substrate processing region. The local plasma may be generated using the same techniques used to create the remote plasma. As with the remote plasma, the energy may be applied using a capacitively-coupled plasma unit by applying RF power between plates above and below the substrate during etching. The local plasma RF power may be between about 5 watts and about 200 watts, between about 10 watts and about 150 watts, between about 15 watts and about 100 watts, or between about 20 watts and about 80 watts in embodiments of the invention. The lower local RF power of the local plasma in the substrate processing region keeps the ionic concentration down so the etch selectivity toward titanium nitride remains high. The local plasma RF power may be less than or about 20% of the remote plasma RF power, less than or about 15% of the remote plasma RF power, or less than or about 10% of the remote plasma RF power.

The local plasma is used, in embodiments, to facilitate removal of a titanium oxide layer which may be on top of the titanium nitride layer. The local plasma may be biased relative to the substrate to further assist removal of any titanium oxide layer by using a physical sputtering mechanism in addition to the chemical mechanism. Titanium oxide may require the sputtering assistance because the bonding is stronger in titanium oxide than in titanium nitride. The local plasma bias RF power may be between about 2 watts and about 100 watts, between about 3 watts and about 75 watts, between about 5 watts and about 60 watts, or between about 10 watts and about 50 watts in embodiments of the invention. The local plasma bias RF power is not included in the local plasma RF power so the total applied RF power is the sum of these two quantities.

During the etching process, the substrate may be maintained may be between about −30° C. and about 400° C. in general. In embodiments, the temperature of the substrate during the dry etches described in this section may be greater than or about −30° C., greater than or about −10° C., greater than or about 10° C., or greater than or about 25° C. The substrate temperatures may be less than or about 400° C., less than or about 350° C., less than or about 250° C. in disclosed embodiments. The substrate processing region may be maintained at or below about 20 Torr during the processes, and may be maintained at or below about 15 Torr, 5 Torr, 1 Torr, 0.1 Torr, etc., or between about 0.1 mTorr and about 10 Torr.

Additional process parameters are disclosed in the course of describing an exemplary processing chamber and system.

Exemplary Processing System

Figure 2A:
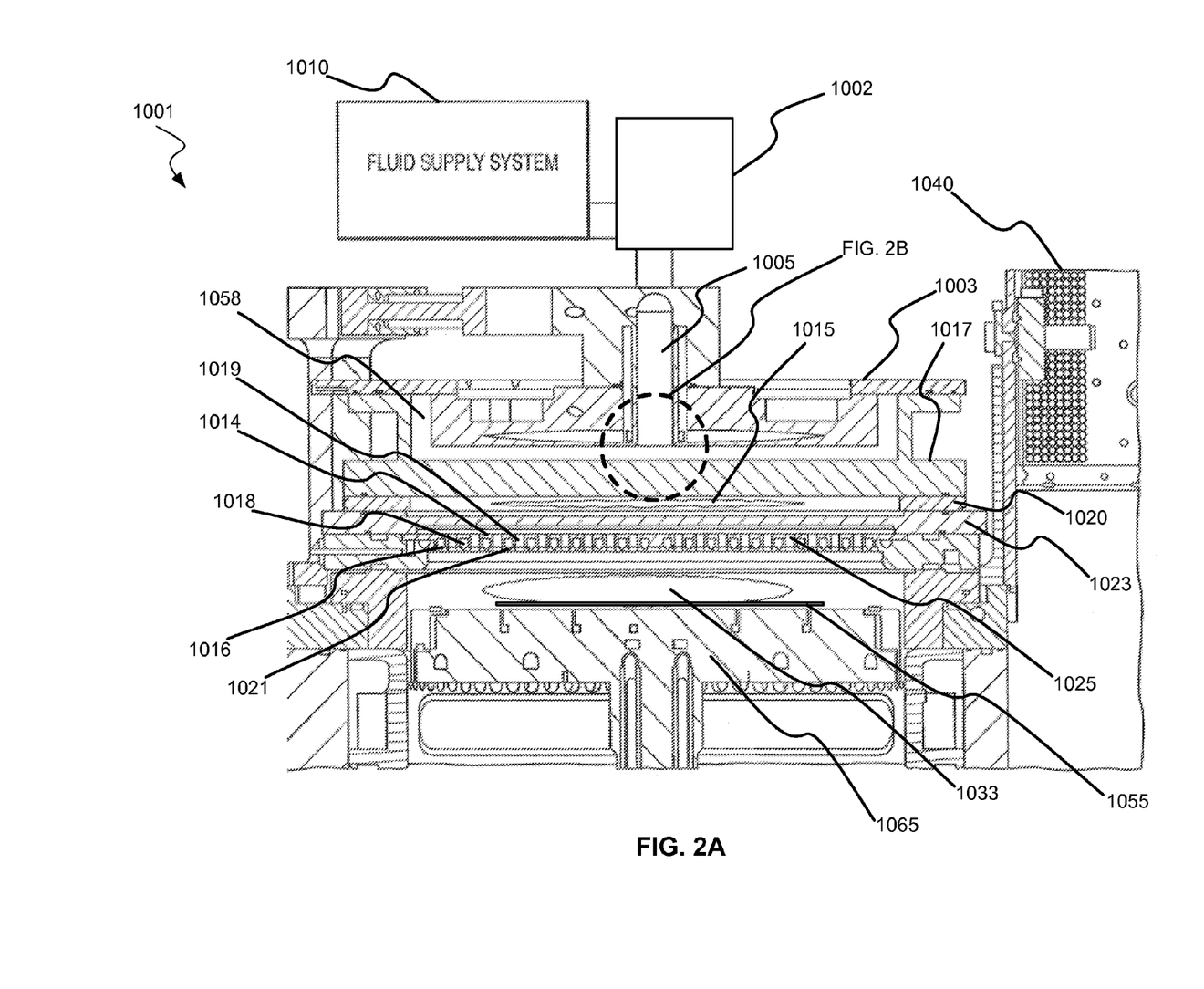
FIG. 2A shows a schematic cross-sectional view of a substrate processing chamber according to the disclosed technology.

FIG. 2A shows a cross-sectional view of an exemplary substrate processing chamber 1001 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into chamber plasma region 1015 through a gas inlet assembly 1105. A remote plasma system (RPS) 1002 may optionally be included in the system, and may process a first gas which then travels through gas inlet assembly 1105. The inlet assembly 1105 may include two or more distinct gas supply channels where the second channel (not shown) may bypass the RPS 1002, if included. Accordingly, in disclosed embodiments the precursor gases may be delivered to the processing chamber in an unexcited state. In another example, the first channel provided through the RPS may be used for the process gas and the second channel bypassing the RPS may be used for a treatment gas in disclosed embodiments. The process gas may be excited within the RPS 1002 prior to entering the chamber plasma region 1015. Accordingly, the chlorine-containing precursor as discussed above, for example, may pass through RPS 1002 or bypass the RPS unit in disclosed embodiments. Various other examples encompassed by this arrangement will be similarly understood.

A cooling plate 1003, faceplate 1017, ion suppressor 1023, showerhead 1025, and a substrate support 1065 (also known as a pedestal), having a substrate 1055 disposed thereon, are shown and may each be included according to disclosed embodiments. The pedestal 1065 may have a heat exchange channel through which a heat exchange fluid flows to control the temperature of the substrate. This configuration may allow the substrate 1055 temperature to be cooled or heated to maintain relatively low temperatures, such as between about −20° C. to about 200° C., or therebetween. The heat exchange fluid may comprise ethylene glycol and/or water. The wafer support platter of the pedestal 1065, which may comprise aluminum, ceramic, or a combination thereof, may also be resistively heated in order to achieve relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 1065, which may be further configured to rotate.

The faceplate 1017 may be pyramidal, conical, or of another similar structure with a narrow top portion expanding to a wide bottom portion. The faceplate 1017 may additionally be flat as shown and include a plurality of through-channels used to distribute process gases. Plasma generating gases and/or plasma excited species, depending on use of the RPS 1002, may pass through a plurality of holes, shown in FIG. 2B, in faceplate 1017 for a more uniform delivery into the chamber plasma region 1015.

Exemplary configurations may include having the gas inlet assembly 1105 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1105, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region. A baffle (not shown) may additionally be located in the chamber plasma region 1015, or otherwise coupled with gas inlet assembly 1105, to affect the flow of fluid into the region through gas inlet assembly 1105.

The ion suppressor 1023 may comprise a plate or other geometry that defines a plurality of apertures throughout the structure that are configured to suppress the migration of ionically-charged species out of chamber plasma region 1015 while allowing uncharged neutral or radical species to pass through the ion suppressor 1023 into an activated gas delivery region between the suppressor and the showerhead. In disclosed embodiments, the ion suppressor 1023 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 1023 may provide increased control over the gas mixture brought into contact with the underlying wafer substrate, which in turn may increase control of the deposition and/or etch characteristics of the gas mixture. In alternative embodiments in which deposition is performed, it can also shift the balance of conformal-to-flowable style depositions for dielectric materials.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor.

The ion suppression element 1023 may function to reduce or eliminate the amount of ionically charged species traveling from the plasma generation region to the substrate. Uncharged neutral and radical species may still pass through the openings in the ion suppressor to react with the substrate.

It should be noted that the complete elimination of ionically charged species in the reaction region surrounding the substrate is not always the desired goal. In many instances, ionic species are required to reach the substrate in order to perform the etch and/or deposition process. In these instances, the ion suppressor may help to control the concentration of ionic species in the reaction region at a level that assists the process.

Showerhead 1025 in combination with ion suppressor 1023 may allow a plasma present in chamber plasma region 1015 to avoid directly exciting gases in substrate processing region 1033, while still allowing excited species to travel from chamber plasma region 1015 into substrate processing region 1033. In this way, the chamber may be configured to prevent the plasma from contacting a substrate 1055 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if the exposed second material is oxide, this material may be further protected by maintaining the plasma remotely from the substrate.

The processing system may further include a power supply 1040 electrically coupled with the processing chamber to provide electric power to the faceplate 1017, ion suppressor 1023, showerhead 1025, and/or pedestal 1065 to generate a plasma in the chamber plasma region 1015 or processing region 1033. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to chamber plasma region 1015. This in turn may allow development of particular plasma characteristics such that precursors may be dissociated in specific ways to enhance the etching profiles produced by these precursors.

A plasma may be ignited in chamber plasma region 1015 above showerhead 1025 and/or substrate processing region 1033 below showerhead 1025. A plasma may be present in chamber plasma region 1015 to produce the radical-chlorine precursors from an inflow of the chlorine-containing precursor. An AC voltage typically in the radio frequency (RF) range may be applied between the conductive top portion of the processing chamber, such as faceplate 1017, and showerhead 1025 and/or ion suppressor 1023 to ignite a plasma in chamber plasma region 1015 during deposition. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 2000 watts, between about 100 watts and about 2000 watts, between about 200 watts and about 1500 watts, or between about 200 watts and about 1000 watts in different embodiments. The RF frequency applied in the exemplary processing system may be low RF frequencies less than about 200 kHz, high RF frequencies between about 10 MHz and about 15 MHz, or microwave frequencies greater than or about 1 GHz in different embodiments. The plasma power may be capacitively-coupled (CCP) or inductively-coupled (ICP) into the remote plasma region.

Plasma power may also be simultaneously applied to both chamber plasma region 1015 and substrate processing region 1033 during etching processes described herein. The frequencies and powers above apply to both regions. Either region may be excited using either a capacitively-coupled plasma (CCP) or an inductively-coupled plasma (ICP). The plasma in chamber plasma region 1015 may have a higher power applied in order to create a high concentration of neutral radicals entering substrate processing region 1033. The plasma power applied to substrate processing region 1033 may be lower in order to not unduly increase the ionic concentration near the substrate. However, the plasma in the substrate processing region 1033 may be biased relative to the substrate in order to apply a sputtering component to remove titanium oxide which may cover the titanium nitride to be etched.

Chamber plasma region 1015 (top plasma in figure) may be left at low or no power when a bottom plasma in the substrate processing region 1033 is turned on to, for example, cure a film or clean the interior surfaces bordering substrate processing region 1033. A plasma in substrate processing region 1033 may be ignited by applying an AC voltage between showerhead 1055 and the pedestal 1065 or bottom of the chamber. A cleaning gas may be introduced into substrate processing region 1033 while the plasma is present.

A fluid, such as a precursor, for example a chlorine-containing precursor, may be flowed into the processing region 1033 by embodiments of the showerhead described herein. Excited species derived from the process gas in chamber plasma region 1015 may travel through apertures in the ion suppressor 1023, and/or showerhead 1025 and react with an additional precursor flowing into the processing region 1033 from a separate portion of the showerhead. Alternatively, if all precursor species are being excited in chamber plasma region 1015, no additional precursors may be flowed through the separate portion of the showerhead. Little or no plasma may be present in the processing region 1033. Excited derivatives of the precursors may combine in the region above the substrate and, on occasion, on the substrate to etch structures or remove species on the substrate in disclosed applications.

Exciting the fluids in the chamber plasma region 1015 directly, or exciting the fluids in the RPS units 1002, may provide several benefits. The concentration of the excited species derived from the fluids may be increased within the processing region 1033 due to the plasma in the chamber plasma region 1015. This increase may result from the location of the plasma in the chamber plasma region 1015. The processing region 1033 may be located closer to the chamber plasma region 1015 than the remote plasma system (RPS) 1002, leaving less time for the excited species to leave excited states through collisions with other gas molecules, walls of the chamber, and surfaces of the showerhead.

The uniformity of the concentration of the excited species derived from the process gas may also be increased within the processing region 1033. This may result from the shape of the chamber plasma region 1015, which may be more similar to the shape of the processing region 1033. Excited species created in the RPS 1002 may travel greater distances in order to pass through apertures near the edges of the showerhead 1025 relative to species that pass through apertures near the center of the showerhead 1025. The greater distance may result in a reduced excitation of the excited species and, for example, may result in a slower growth rate near the edge of a substrate. Exciting the fluids in the chamber plasma region 1015 may mitigate this variation for the fluid flowed through RPS 1002, or alternatively bypassed around the RPS unit.

The processing gases may be excited in chamber plasma region 1015 and may be passed through the showerhead 1025 to the processing region 1033 in the excited state. While a plasma may be generated in the processing region 1033, a plasma may alternatively not be generated in the processing region. In one example, the only excitation of the processing gas or precursors may be from exciting the processing gases in chamber plasma region 1015 to react with one another in the processing region 1033. As previously discussed, this may be to protect the structures patterned on the substrate 1055.

In addition to the fluid precursors, there may be other gases introduced at varied times for varied purposes, including carrier gases to aid delivery. A treatment gas may be introduced to remove unwanted species from the chamber walls, the substrate, the deposited film and/or the film during deposition. A treatment gas may be excited in a plasma and then used to reduce or remove residual content inside the chamber. In other disclosed embodiments the treatment gas may be used without a plasma. When the treatment gas includes water vapor, the delivery may be achieved using a mass flow meter (MFM), an injection valve, or by commercially available water vapor generators. The treatment gas may be introduced to the processing region 1033, either through the RPS unit or bypassing the RPS unit, and may further be excited in the first plasma region.

Figure 2B:
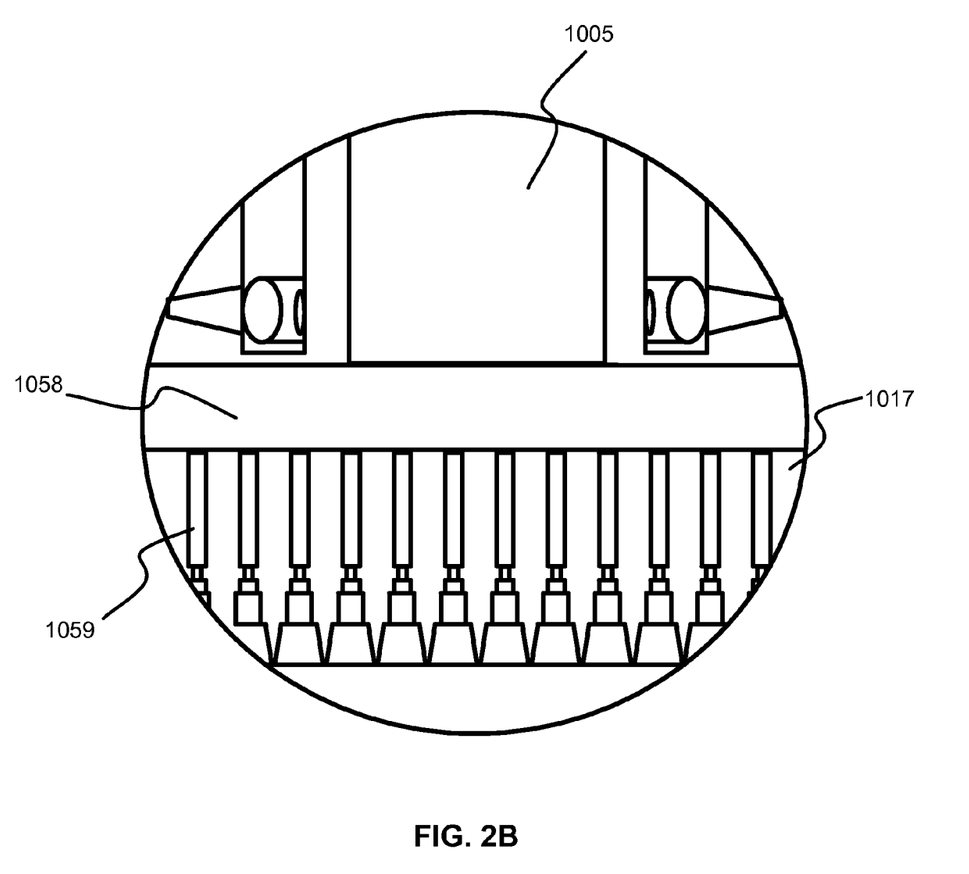
FIG. 2B shows a schematic cross-sectional view of a portion of a substrate processing chamber according to the disclosed technology.

FIG. 2B shows a detailed view of the features affecting the processing gas distribution through faceplate 1017. As shown in FIG. 2A and FIG. 2B, faceplate 1017, cooling plate 1003, and gas inlet assembly 1105 intersect to define a gas supply region 1058 into which process gases may be delivered from gas inlet 1105. The gases may fill the gas supply region 1058 and flow to chamber plasma region 1015 through apertures 1059 in faceplate 1017. The apertures 1059 may be configured to direct flow in a substantially unidirectional manner such that process gases may flow into processing region 1033, but may be partially or fully prevented from backflow into the gas supply region 1058 after traversing the faceplate 1017.

Figure 2C:
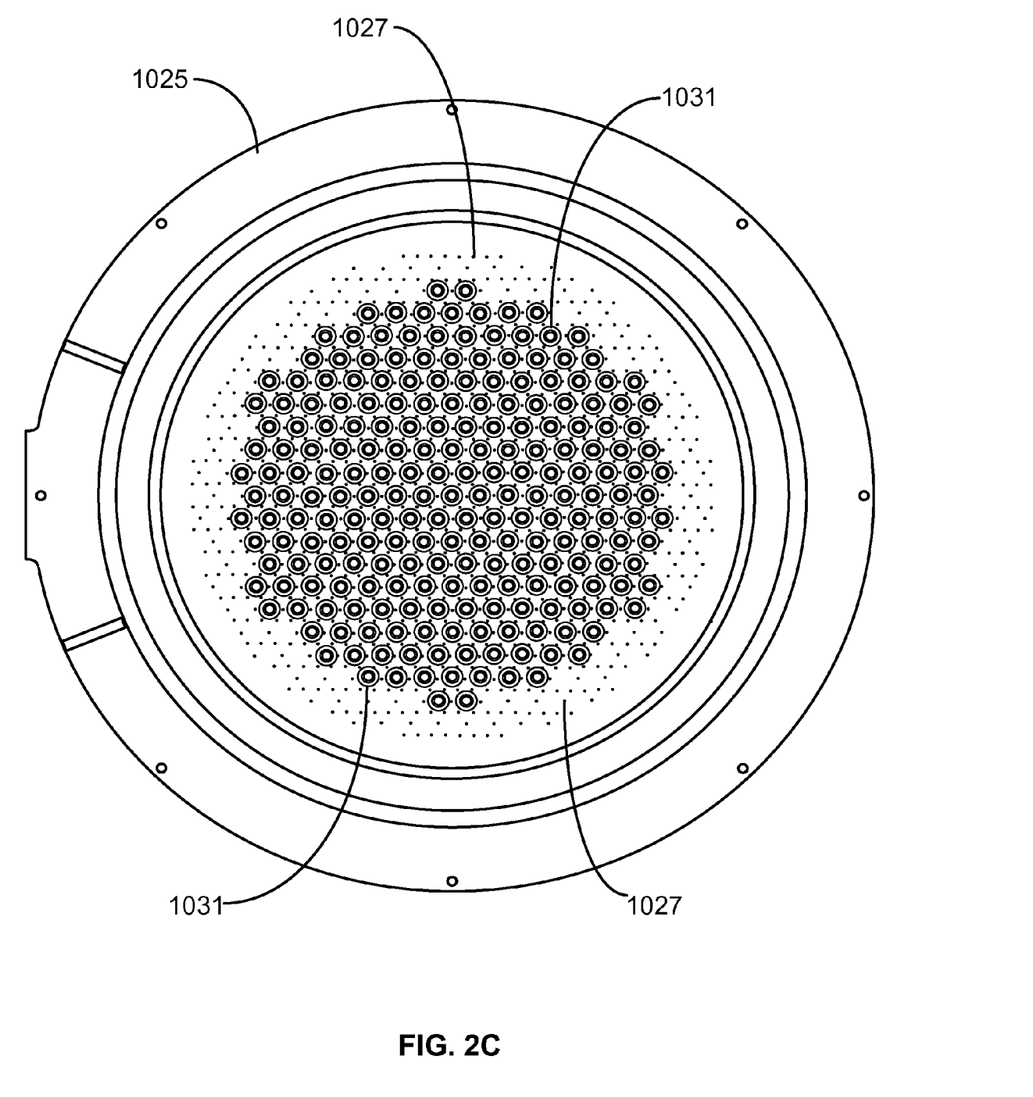
FIG. 2C shows a bottom plan view of a showerhead according to the disclosed technology.

The gas distribution assemblies such as showerhead 1025 for use in the processing chamber section 1001 may be referred to as dual channel showerheads (DCSH) and are additionally detailed in the embodiments described in FIG. 2A as well as FIG. 2C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIG. 2 includes a dual-channel showerhead, it is understood that alternative distribution assemblies may be utilized that maintain first and second precursors fluidly isolated prior to the processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into the RPS 1002 and/or chamber plasma region 1015 may contain chlorine, e.g., $Cl_2$ or $BCl_3$ and the like. The process gas may also include a carrier gas such as helium, argon, nitrogen ($N_2$), etc. Plasma effluents may include ionized or neutral derivatives of the process gas and may also be referred to herein as a radical-chlorine precursor referring to the atomic constituent of the process gas introduced.

FIG. 2C is a bottom view of a showerhead 1025 for use with a processing chamber according to disclosed embodiments. Showerhead 1025 corresponds with the showerhead shown in FIG. 2A. Through-holes 1031, which show a view of first fluid channels 1019, may have a plurality of shapes and configurations in order to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

An additional dual channel showerhead, as well as this processing system and chamber, are more fully described in patent application Ser. No. 13/251,714 filed on Oct. 3, 2011, which is hereby incorporated by reference for all purposes to the extent not inconsistent with the claimed features and description herein.

The chamber plasma region 1015 or a region in an RPS may be referred to as a remote plasma region. In embodiments, the radical precursor, e.g., a radical-chlorine precursor, is created in the remote plasma region and travels into the substrate processing region. Plasma power may or may not be applied only to the remote plasma region in embodiments depending on whether a titanium oxide layer needs to be broken through to access the titanium nitride layer. Chlorine or another chlorine-containing precursor may be flowed into chamber plasma region 1015 at rates between about 25 sccm and about 500 sccm, between about 50 sccm and about 150 sccm, or between about 75 sccm and about 125 sccm in disclosed embodiments. Methane or another hydrocarbon may be flowed into the.

Combined flow rates of precursors into the chamber may account for 0.05% to about 20% by volume of the overall gas mixture; the remainder being carrier gases. The chlorine-containing precursor may be flowed into the remote plasma region, but the plasma effluents may have the same volumetric flow ratio in embodiments. In the case of the chlorine-containing precursor, a purge or carrier gas may be first initiated into the remote plasma region before the chlorine-containing gas to stabilize the pressure within the remote plasma region.

Substrate processing region 1033 can be maintained at a variety of pressures during the flow of precursors, any carrier gases, and plasma effluents into substrate processing region 1033. The pressure may be maintained between about 0.1 mTorr and about 20 Torr or between about 1 Torr and about 5 Torr in different embodiments.

Figure 3:
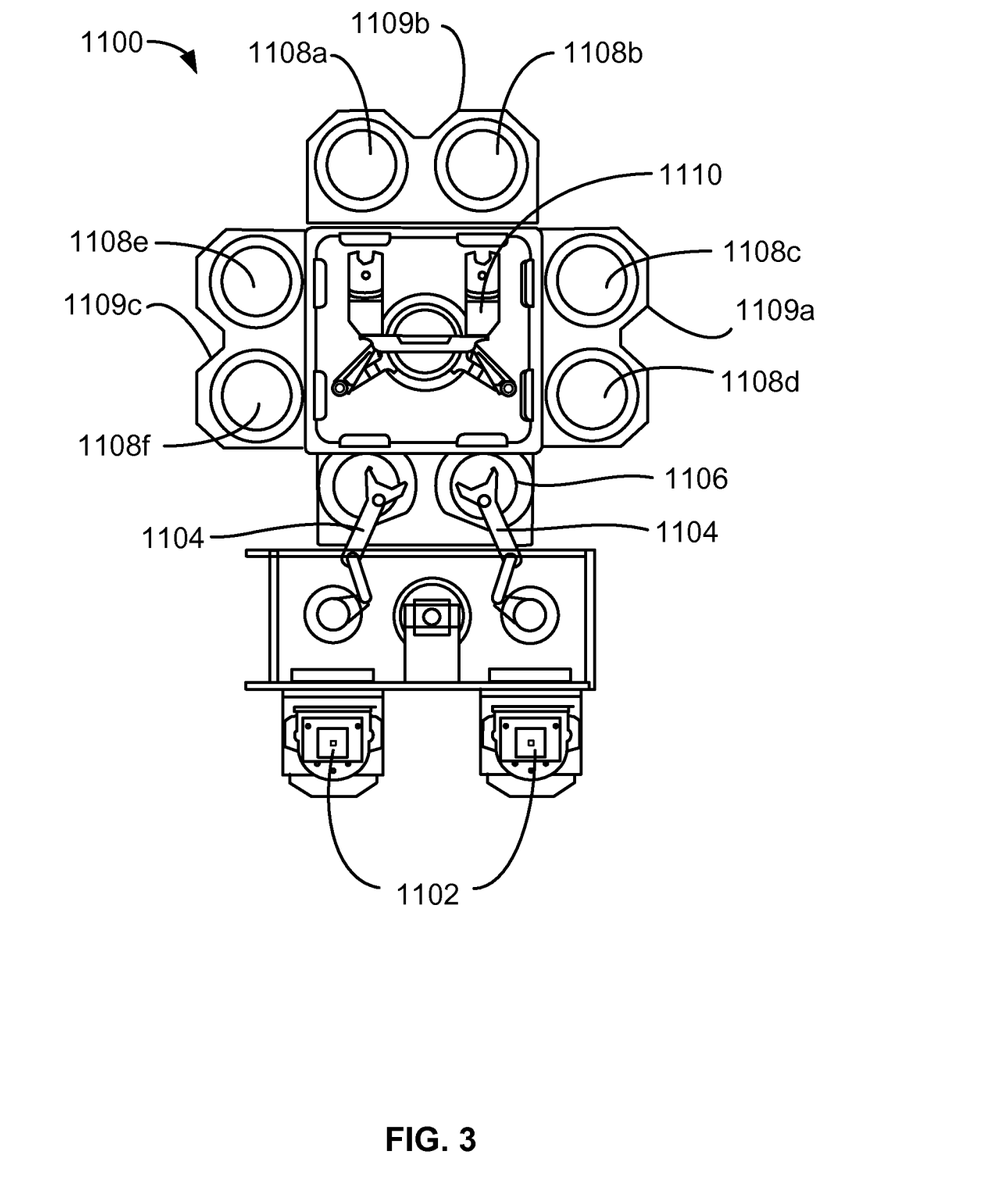
FIG. 3 shows a top plan view of an exemplary substrate processing system according to the disclosed technology.

Embodiments of the deposition systems may be incorporated into larger fabrication systems for producing integrated circuit chips. FIG. 3 shows one such processing system 1101 of deposition, etching, baking, and curing chambers according to disclosed embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 1108a-f may include one or more system components for depositing, annealing, curing and/or etching a dielectric film on the substrate wafer. In one configuration, two pairs of the processing chamber, e.g., 1108c-d and 1108e-f, may be used to deposit dielectric material on the substrate, and the third pair of processing chambers, e.g., 1108a-b, may be used to etch the deposited dielectric. In another configuration, all three pairs of chambers, e.g., 1108a-f, may be configured to etch a dielectric film on the substrate. Any one or more of the processes described may be carried out in chamber(s) separated from the fabrication system shown in different embodiments.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly Si but may include minority concentrations of other elemental constituents such as nitrogen, oxygen, hydrogen, carbon and the like. Exposed "titanium nitride" of the patterned substrate is predominantly titanium and nitrogen but may include minority concentrations of other elemental constituents such as oxygen, hydrogen, carbon and the like. Of course, "exposed titanium nitride" may consist of only titanium and nitrogen. Exposed "silicon nitride" of the patterned substrate is predominantly $Si_3N_4$ but may include minority concentrations of other elemental constituents such as oxygen, hydrogen, carbon and the like. "Exposed silicon nitride" may consist only of silicon and nitrogen. Exposed "silicon oxide" of the patterned substrate is predominantly $SiO_2$ but may include minority concentrations of other elemental constituents such as nitrogen, hydrogen, carbon and the like. In some embodiments, silicon oxide films etched using the methods disclosed herein consist of silicon and oxygen. "Titanium oxide" is predominantly titanium and oxygen but may include minority concentrations of other elemental constituents such as nitrogen, hydrogen, carbon and the like. Titanium oxide may consist of titanium and oxygen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-chlorine" are radical precursors which contain chlorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a patterned substrate in a substrate processing region of a substrate processing chamber, wherein the patterned substrate has an exposed titanium nitride region and an exposed second material region, the method comprising:

flowing a chlorine-containing precursor and a carbon-and-hydrogen containing precursor into a remote plasma region fluidly coupled to the substrate processing region while forming a remote plasma in the remote plasma region using a remote RF power to produce plasma effluents; and etching exposed titanium nitride from the substrate by flowing the plasma effluents into the substrate processing region through through-holes in a showerhead.

2. The method of claim 1 wherein the exposed titanium nitride region was covered by a titanium oxide layer prior to the etching operation, wherein the titanium oxide layer is removed by flowing the plasma effluents into the substrate processing region to form the exposed titanium nitride region prior to the operation of etching the exposed titanium nitride.

3. The method of claim 1 wherein the exposed titanium nitride region consists of titanium and nitrogen.

4. The method of claim 1 wherein the carbon-and-hydrogen-containing precursor comprises methane.

5. The method of claim 1 wherein the carbon-and-hydrogen-containing precursor consists of carbon and hydrogen.

6. The method of claim 1 wherein etching the exposed titanium nitride region comprises etching titanium nitride with a titanium nitride etch rate greater than ten times the etch rate of the exposed second material region.

7. The method of claim 1 wherein the operation of etching the titanium nitride comprises etching titanium nitride faster than silicon nitride by a ratio of about 100:1 or more, faster than silicon oxide by a ratio of about 100:1 or more, faster than silicon carbon nitride by a ratio of about 5:1 or more or faster than silicon oxycarbide by a ratio of about 100:1 or more.

8. The method of claim 1 wherein the chlorine-containing precursor comprises at least one of chlorine ($Cl_2$) and boron trichloride.

9. The method of claim 1 wherein a pressure within the substrate processing region is between about 0.01 Torr and about 20 Torr during the etching operation.

10. The method of claim 1 wherein forming a remote plasma in the remote plasma region to produce plasma effluents comprises applying a remote RF power between about 40 watts and about 1500 watts to the plasma region.

11. The method of claim 1 further comprising forming a local plasma in the substrate processing region during the operation of forming the remote plasma in the plasma region.

12. The method of claim 11 wherein forming the local plasma in the substrate processing region comprises applying a local plasma RF power between about 5 watts and about 200 watts to the plasma region.

13. The method of claim 11 wherein forming the local plasma comprises applying a local plasma RF power which is about twenty percent or less than the remote RF power.

14. The method of claim 11 wherein forming the local plasma in the substrate processing region comprises applying a local plasma bias RF power between the plasma and the patterned substrate.

15. The method of claim 14 wherein the local plasma bias RF power is between about 2 watts and about 100 watts.

16. The method of claim 1 wherein a processing temperature of the substrate is greater than or about −30° C. and less than or about 400° C. during the etching operation.

17. A method of etching a patterned substrate in a substrate processing region of a substrate processing chamber, wherein the patterned substrate has an exposed titanium nitride region and an exposed second material region, the method comprising:

flowing a chlorine-containing precursor into a remote plasma region fluidly coupled with the substrate processing region while forming a remote plasma in the remote plasma region using a remote RF power to produce plasma effluents;

flowing the plasma effluents into the substrate processing region through a showerhead;

removing a titanium oxide layer overlying the titanium nitride region to expose the titanium nitride region; and etching exposed titanium nitride from the substrate with the plasma effluents.

18. The method of claim 17, wherein removing the titanium oxide layer further comprises:

forming a plasma in the substrate processing region; and biasing the plasma in the substrate processing region to at least partially sputter the titanium oxide layer, wherein the bias power is between about 3 and about 75 Watts.

19. The method of claim 1, wherein the plasma effluents are flowed through an ion suppression element reducing the concentration of ions entering the substrate processing region.

* * * * *